(12) United States Patent
Dagher et al.

(10) Patent No.: US 8,196,073 B2
(45) Date of Patent: Jun. 5, 2012

(54) STRUCTURE FOR REDUCED AREA ACTIVE ABOVE-GROUND AND BELOW-SUPPLY NOISE SUPPRESSION CIRCUITS

(75) Inventors: Rafik F. Dagher, Cedar Park, TX (US); Christopher M. Durham, Round Rock, TX (US); Peter J. Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1023 days.

(21) Appl. No.: 12/129,532

(22) Filed: May 29, 2008

(65) Prior Publication Data
US 2009/0106708 A1  Apr. 23, 2009

Related U.S. Application Data

(63) Continuation of application No. 11/877,219, filed on Oct. 23, 2007, now Pat. No. 7,511,529.

(51) Int. Cl.
*G06F 17/50* (2006.01)
(52) U.S. Cl. .................................... 716/100
(58) Field of Classification Search ............... 716/100
See application file for complete search history.

(56) References Cited

U.S. PATENT DOCUMENTS

| 6,181,156 | B1 | 1/2001 | Durham et al. | |
| 6,252,418 | B1 | 6/2001 | Durham et al. | |
| 6,577,152 | B1 | 6/2003 | Durham et al. | |
| 7,511,529 | B1 * | 3/2009 | Dagher et al. | 326/27 |
| 7,923,808 | B2 * | 4/2011 | Ding et al. | 257/508 |
| 8,037,337 | B2 * | 10/2011 | Pratt et al. | 713/500 |
| 2008/0244479 | A1 * | 10/2008 | Bonaccio et al. | 716/4 |
| 2009/0106724 | A1 * | 4/2009 | Arsovski et al. | 716/7 |

\* cited by examiner

*Primary Examiner* — Suchin Parihar
(74) *Attorney, Agent, or Firm* — Yee & Associates, P.C.; Matthew B. Talpis

(57) ABSTRACT

A design structure for noise suppression. A design structure has a noise detection unit, a noise suppression unit, and a control unit. The noise suppression unit has an input and an output, wherein the input of the noise detection unit is connected to a signal and generates a signal change at the output if a change in the signal is detected. The noise suppression unit has an input and an output, wherein the input of the noise suppression unit is connected to the output of the noise detection unit and generates a correction to the signal in response to detecting the signal change at the output of the noise detection unit. The control unit has an input and an output, wherein input to the control unit is connected to the signal and turns off the noise suppression unit if a state change is detected in the signal.

20 Claims, 3 Drawing Sheets

US 8,196,073 B2

STRUCTURE FOR REDUCED AREA ACTIVE ABOVE-GROUND AND BELOW-SUPPLY NOISE SUPPRESSION CIRCUITS

This application is a continuation-in-part of application Ser. No. 11/877,219, filed Oct. 23, 2007.

BACKGROUND

1. Field of the Invention

The present invention relates to a design structure, and more specifically to a design structure for electronic circuits and in particular to electric noise suppression circuits.

2. Description of the Related Art

As engineers seek ever increasing speeds in very large scale integration (VLSI) chips, complex problems continue to rise to the forefront. For example, as process feature sizes continue to shrink, metallurgical limitations are continually raising line-to-line interconnect coupling effects. These effects lead to increased concern over signal noise and noise tolerance. Design engineers continually fight and solve problems relating to signal noise.

Signal noise can take several forms. Due to coupling effects, signals can bounce in one or more of four distinct directions: above the ground, below the supply, below the ground, and above the supply. Of these directions, two may cause errors in circuit operations. Above-ground and below-supply signal noise can cause false switching events if the coupling effects causes the voltage level of a signal to cross the switching threshold of a given destination circuit. Below-ground signal noise and above-supply signal noise can cause a loss of state in certain types of large circuits.

To solve above-ground and below-supply noise problems, circuits have been employed to suppress this type of noise by adding transistors to the overall system. This solution works well as long as space or circuit density on a chip is not a concern. As chips increase in size, speed, and complexity, a larger emphasis occurs on designing compact circuits with a minor impact on chip density.

Currently available noise suppression circuits provide desired type of noise suppression. These circuits, however, require a significant area on the chip to include this type of circuit. This increased use in area can be difficult in applications in which adding circuitry is costly or prohibited.

Therefore, it would be advantageous to provide an above-ground and below-supply noise suppression circuit that can reduce noise effects.

BRIEF SUMMARY

The illustrative embodiments provide a design structure for noise suppression. The design structure comprises a circuit having a noise detection unit, a noise suppression unit, and a control unit. The noise suppression unit has an input and an output, wherein the input of the noise detection unit is connected to a signal and generates a signal change at the output if a change in the signal is detected. The noise suppression unit has an input and an output, wherein the input of the noise suppression unit is connected to the output of the noise detection unit and generates a correction to the signal in response to detecting the signal change at the output of the noise detection unit. The control unit has an input and an output, wherein input to the control unit is connected to the signal and turns off the noise suppression unit if a state change is detected in the signal.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
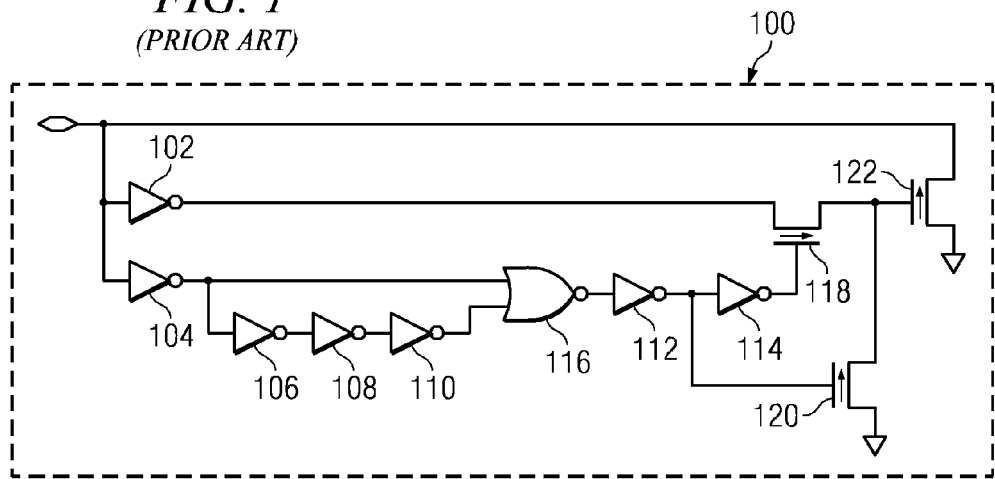
FIG. 1 is a diagram of a currently used above-ground noise cancellation circuit.

With reference now to the figures and particularly with reference to FIG. 1, a diagram of a currently used above-ground noise cancellation circuit is depicted. Noise suppression circuit 100 contains inverters 102, 104, 106, 108, 110, 112, 114. Additionally, this circuit also contains NAND gate 116 along with transistors 118, 120, and 122. Each of the inverters in noise suppression circuit 100 requires two transistors to implement. NAND gate 116 includes three transistors. As a result, noise suppression circuit 100, in this example, requires twenty-one transistors to implement.

Adding twenty-one transistors to a chip requires additional area on the chip for noise suppression circuit 100. In some cases, this additional area may be considered significant, costly, or even prohibited.

Figure 2:
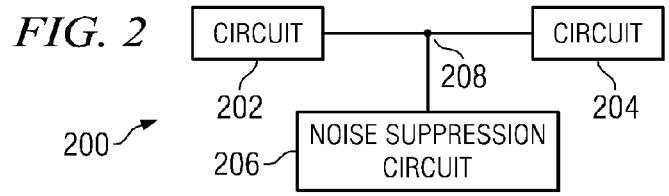
FIG. 2 is a diagram illustrating a circuit system in accordance with an advantageous embodiment of the present disclosure.

Turning now to FIG. 2, a diagram illustrating a circuit system is depicted in accordance with an advantageous embodiment of the present invention. In this example, circuit system 200 contains circuit 202 and circuit 204. Circuit 202 is a signal source that generates a signal that is used by other circuits, such as circuit 204. In this example, noise suppression circuit 206 is connected to node 208 to generate a protected signal for circuit system 200. Without noise suppression circuit 206, circuit 204 may change state or lose the state in response to a glitch in the voltage output by circuit 202. A state in a circuit, in these examples, is a logic "1" or a logical "0". These states are represented by a voltage level that is above a threshold level for a logic "1" and a voltage level that is below another threshold level for a logic "0" in these examples. A change in state means that the voltage level has crossed a threshold.

The different illustrative embodiments provide a design structure comprising a noise suppression circuit that has a noise detection unit, a noise suppression unit, and a control unit. The noise detection unit has an input and output in which the input of the noise detection unit is connected to a signal and generates a signal change at the output if a change in the signal is detected. The noise suppression unit has an input and output in which the input of the noise suppression unit is connected to the output of the noise detection unit. This noise suppression unit generates a correction to the signal in response to detecting a signal change at the output at the noise detection unit. The control unit has an input and output. The input of the control unit is connected to the signal and turns off the noise suppression unit if a state change is detected in the signal.

This state change is in contrast to a noise or change in voltage that is not meant to change the state of the signal. This configuration of the noise suppression circuit allows for active noise cancellation for both above-ground and below-ground voltage supply noises depending on the type of transistors implemented in the different units. Another feature provided by the configuration, in this illustrative embodiment, is a reduction in the number of transistors needed to implement the noise suppression circuit as compared to conventional presently available circuits, such as noise suppression circuit 100 in FIG. 1. By reducing the number of transistors required, the amount of area on the chip needed for the noise suppression circuit, in the illustrative embodiments, is reduced.

In the illustrative embodiments, the noise suppression circuit may include a first transistor having a gate connected to a signal source and a first source/drain connected to a detect node, and a second source/drain connected to a first power supply voltage; a second transistor having a gate connected to the first power supply voltage, first source/drain connected to a second power supply voltage, and a second source/drain connected to the detect node; an inverter having an input connected to the detect node; a third transistor having a gate connected to an output of the inverter, a first source/drain connected to the first power supply voltage, and a second source/drain; a fourth transistor having a first source/drain connected to the signal source, a second source/drain connected to the second source/drain of the third transistor; and a second inverter having an input connected to the signal source and an output connected to a gate of the fourth transistor.

Figure 3:
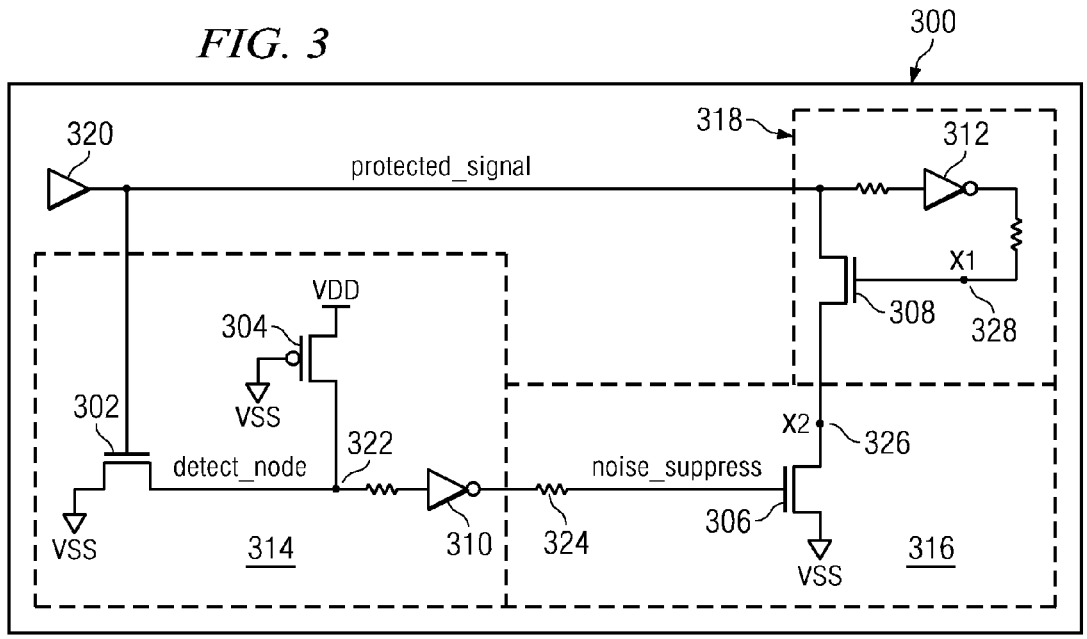
FIG. 3 is a diagram illustrating an above-supply noise suppression circuit with suppressing noises above-ground and below-supply in accordance with an illustrative embodiment.

With reference now to FIG. 3, a diagram illustrating an above-supply noise suppression circuit for suppressing noises above-ground and below-supply is depicted in accordance with an illustrative embodiment. In this example, noise suppression circuit 300 has transistors 302, 304, 306, and 308. Additionally, noise suppression circuit 300 also includes inverter 310 and inverter 312. Transistor 302, transistor 304, and inverter 310 form noise detection unit 314. Inverter 310 and transistor 306 form noise suppression unit 316, and inverter 312 and transistor 308 form control unit 318. In these examples, transistors 302, 306, and 308 are n-type metal-oxide semiconductor (NMOS) field effect transistors. Transistor 304 is a p-channel metal-oxide semiconductor (PMOS) field effect transistor.

Transistor 302 has its gate connected to protected signal 320. In this example, the drain of transistor 302 is connected to detect node 322, while the source of transistor 302 is connected to a ground supply voltage. Transistor 302 turns on when protected signal 320 has a voltage that rises above a threshold. This threshold is set through process technologies used in creating transistor 302 in these examples. The threshold voltages used may vary depending on the particular implementation. When the voltage rises above the threshold, detect node 322 is pulled toward a low state or a logic "0".

In the illustrative embodiments, transistor 304 is in a "continuously on" state. This transistor is a weak p-channel device in this depicted example. Transistor 304 is considered to be weak because the current capability of this transistor is very small with respect to other transistors, such as transistor 302. Transistor 304 is designed as a weak transistor, in these examples, by using a long device channel in transistor 304 as compared to other transistors in the circuit. Alternatively, transistor 304 may be made weak by stacking multiple devices in series. Any combination of these two features may be used.

The gate of transistor 304 is grounded, resulting in this transistor to be in an "always on" state. As a result, transistor 304 tends to keep detect node 322 at a high level, except when transistor 302 pulls detect node 322 to a low level in response to an input signal. In these examples, a high level is the upper power supply voltage, while a low level is the lower power supply voltage. In these examples, the upper power supply voltage is upper power supply voltage VDD, while the lower power supply voltage is VSS in this example. This upper power supply voltage is also referred to as a power supply rail. Lower power supply voltage VSS is ground in these examples.

As illustrated, the source of transistor 304 is connected to an upper power supply voltage VDD, while the drain of transistor 304 is connected to detect node 322. In this example, the gate of transistor 304 is grounded by connecting this gate to a ground, which is lower supply voltage VSS in this example. This lower supply voltage VSS level represents a low state or logic "0".

Transistor 304 forces detect node 322 to a supply rail voltage when transistor 302 is turned off. A supply rail voltage is equal to a logic "1" in these examples. Transistor 304 is designed in this weak state to permit transistor 302 to quickly pull detect node 322 to a low state. In pulling a voltage level to a low state quickly, the idea is that transistor 302 is required to be able to sink more current quickly than transistor 304 can provide or source currents. With transistor 304 being designed as weaker than transistor 302, this situation can occur. In other words, transistor 304 is designed to allow transistor 302 to pull the signal at detect node 322 to a different state without requiring transistor 302 to be fully turned on. This design means a change in voltage level in protected signal 320 can cause the voltage at detect node 322 to be changed, even though the change in the voltage level in protected signal 320 has not been changed to a logic "1" in this example.

Inverter 310 has its input connected to detect node 322. Inverter 310 functions as a gate to switch the noise suppression signal at noise suppression node 324 to a high voltage level when detect node 322 is at a low state. Inverter 310 is designed with a high beta ratio such that detect node 322 does not have to move to a significantly low state to switch the noise suppression signal at noise suppression node 324.

In the illustrative embodiments, a significantly low voltage level is a device threshold voltage in these examples. This voltage may be, for example, 200 mv. The level at which switching occurs is determined by the ratio of the p-channel metal-oxide semiconductor versus n-channel metal-oxide semiconductor devices in inverter 310. With an above-ground example, the p-channel metal-oxide semiconductor device is made considerably larger as compared to the n-channel metal-oxide semiconductor device to allow a small movement on detect node 322 to cause inverter 310 to see this change as a logic "0" or a "low" signal. This results in inverter 310 driving noise suppression node 324 to a high state.

Transistor 306 has its gate connected to noise suppression node 324 and its source connected to a ground supply voltage. The drain of transistor 306 is connected to node X2 326. Transistor 306 pulls node X2 326 to ground when the noise suppression signal is at a high state.

Inverter 312 has its input connected to protected signal 320. Inverter 312 also is designed with a high beta ratio such that the above-ground noise glitches that may occur on protected signal 320 do not propagate to inverter 312 to force node X1 328 to a low state. In these examples, a high beta ratio means that a p-channel metal-oxide semiconductor device is larger than the n-channel metal-oxide semiconductor device in the inverter. The device is different enough to move the logical switching point of inverter 312 to the upper power supply voltage VDD.

The beta ratio is selected such that above-ground noise glitches, in these examples, do not propagate to inverter 312. A full rail switch at protected signal 320, however, forces the output of inverter 312 to a low state. A full rail switch is a change in the voltage that changes the state or logic of the signal, such as changing from a logic "1" to a logic "0" or from a logic "0" to a logic "1".

Transistor 308 has its gate connected to the output of inverter 312. In this example, the connection is through node X1 328. The drain of transistor 308 is connected to protected signal 320, while the source of transistor 308 is connected to node X2 326 in this illustrative example. Inverter 312 turns transistor 308 on and off. In these depicted examples, inverter 312 keeps node X1 328 high while protected signal 320 is at a low state during noise glitches. Inverter 312 forces node X1 328 to a low state if protected signal 320 is at a high state.

In the examples as described above, transistors 302 and 304 are part of noise detection unit 314, which function to detect noise that may be present in protected signal 320. Inverter 310 and transistor 306 are part of noise suppression unit 316 and function to perform noise suppression when noise, such as voltage glitches, is present in protected signal 320. Transistor 308 and inverter 312 are part of control unit 318 and function to turn on and off the noise suppression function of noise suppression unit 316. The noise suppression function is turned off by control unit 318 when protected signal 320 changes logic states, such as a change from low-to-high or high-to-low.

For logical functions performed in a circuit containing noise suppression circuit 300, noise detection unit 314 switches between different states. Protected signal 320 may switch from a high-to-low state and from a low-to-high state. These switches correspond to a transition in states from a logic "1" to a logic "0" and from a logic "0" to a logic "1". As protected signal 320 changes, noise suppression circuit 300 performs active noise cancellation functions.

If protected signal 320 switches from a high-to-low state, node X1 328 transitions from a low-to-high state. When node X1 328 is in a high state, a path to ground is prevented as transistor 306 is forced or turned off while node X1 328 is at a high state. Transistor 306 is in an on state when node X1 328 is at a low state.

If protected signal 320 switches from a low-to-high state, node X1 328 changes from a high-to-low state. In a low state, node X1 328 turns off transistor 308 much quicker than through the path formed through transistor 302, inverter 310, and transistor 306. As a result, a path to ground is never present from protected signal 320 through transistors 308 and 306 during a logical switch event.

However, during a noise event above-ground, protected signal 320 does not make a full logical transition from a high state to a low state and only sees a "glitch" in the voltage. This glitch, if not removed, can potentially cause circuitry connected to protected signal 320 to switch and/or effect signal propagation delay. When such a noise event occurs, noise suppression unit 316 in noise suppression circuit 300 responds to reduce the effects of voltage glitches.

In these examples, a voltage glitch occurs when a change in the voltage level is present in a signal, such as protected signal 320, that is not a transition from a high-to-low to low-to-high state. In a steady state, when protective signal 320 is at a low state, transistor 302 remains off and transistor 304 pulls detect node 322 to a high state. This results in forcing noise suppression node 324 to a low state. As a result, transistor 306 is turned off, preventing a path from ground ever occurring through transistor 308. In this example, inverter 312 forces node X1 328 to a high state keeping transistor 308 turned on.

When protected signal 320 rises above a threshold voltage, transistor 302 turns on. As a result, detect node 322 is pulled down to a low state because transistor 304 is weaker than transistor 302.

As a result of detect node 322 being moved to a low state, inverter 310 forces noise suppression node 324 to a high state. In these illustrative examples, a high beta ratio used in inverter 310 allows a small amount of change or movement in the voltage on detect node 322 and results in an out at inverter 310 that causes noise suppression node 324 to move to a high state.

When noise suppression node 324 is at a high state or above a threshold, transistor 306 turns on creating a potential or possible path to ground through transistor 308 and transistor 306.

If protected signal 320 switches to a high state or logic "1", inverter 312 switches and forces node X1 328 to a low state. This change in node X1 328 turns off transistor 308. However, if the switch, voltage, or change on protected signal 320 is an above-ground noise glitch, inverter 310 does not change its output. As a result, inverter 312 does not react and detect node 322 remains in a high state. Consequently, transistor 308 stays in an on state. In these examples, the high beta ratio used in inverter 312 prevents a non-logical switch that may force node X1 328 to an off state, turning off transistor 308.

The combination of transistor 306 and transistor 308 remaining on creates a path to ground from protected signal 320. This path is present during any noise event. When a noise event, such as a glitch, occurs, protected signal 320 is pulled back to a low state. This situation results in a continuation of the noise glitch event, maintaining or restoring the original value of the data.

Figure 4A:
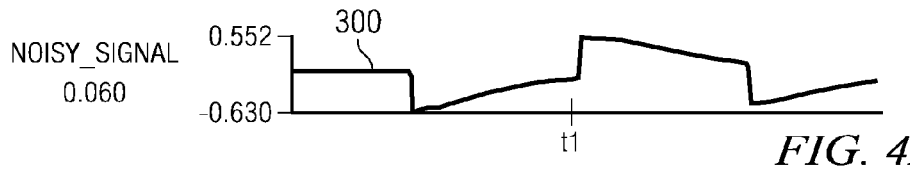
FIGS. 4A-4F are wave form diagrams depicting simulation results for various nodes in a noise suppression circuit in accordance with an illustrative embodiment.
Figure 4B:
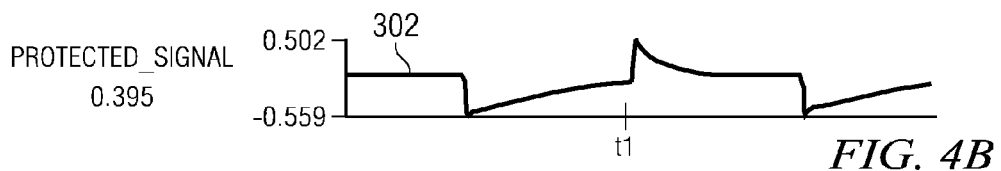
Figure 4C:
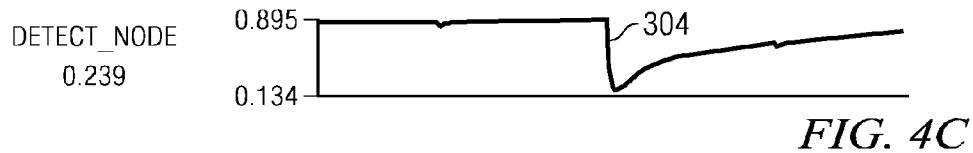
Figure 4D:
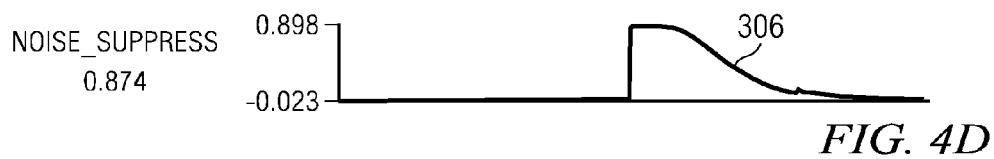
Figure 4E:
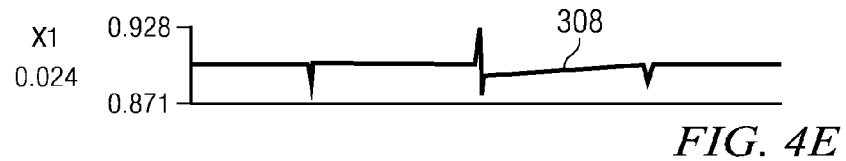
Figure 4F:

Turning now to FIGS. 4A-4F, wave form diagrams depicting simulation results for various nodes in the noise suppression circuit in FIG. 3 are depicted in accordance with an illustrative embodiment. Signal 300 in FIG. 4A illustrates a wave form for a signal that does not use a noise suppression circuit, such as noise suppression circuit 300 in FIG. 3. Signal 302 in FIG. 4B represents a wave form for a protected signal, such as protected signal 320 in FIG. 3. Signal 304 represents a wave form for detect node 322 in FIG. 3, and signal 306 in FIG. 4D represents a wave form at noise suppression node 324 in FIG. 3. Signal 308 in FIG. 4E represents a wave form for node X1 328 in FIG. 3, while signal 310 in FIG. 4F represents a wave form for a response at node X2 326 in FIG. 3.

As can be seen with respect to signal 302, the protected signal increases at time t1 and drops quickly because of the noise suppression circuit. In these illustrative examples, the term quickly is related to the processor and technology speed. For example, quickly may be considered to be ten two hundredths of a second, depending on the implementation. In contrast, the noisy signal at time t1 in signal 300 does not drop quickly and may cause switching in other circuits connected to this unprotected signal. Signal 304 illustrates the detection of the noise glitch, while signal 306 demonstrates the noise suppression that occurs.

Figure 5:
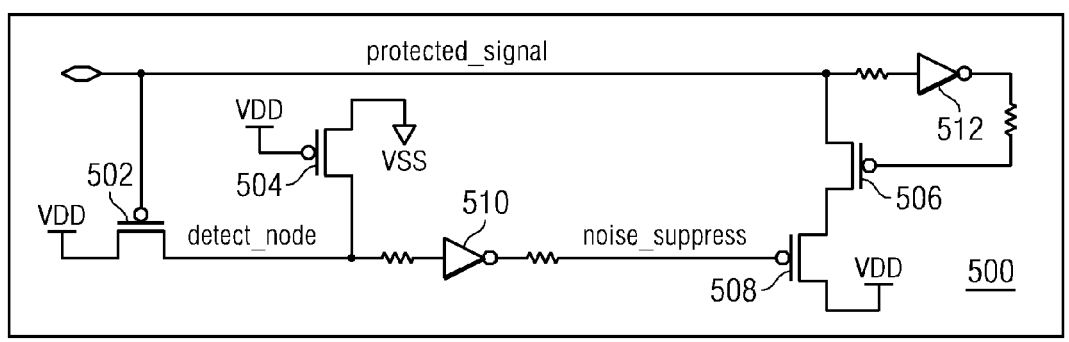
FIG. 5 is a below-supply noise suppression circuit in accordance with an illustrative embodiment.

With reference now to FIG. 5, a below-supply noise suppression circuit is depicted in accordance with an illustrative embodiment. Noise suppression circuit 500 is similar to noise suppression circuit 300 in FIG. 3. As depicted in this example, noise suppression circuit 500 includes transistors 502, 504, 506, and 508. Additionally, noise suppression circuit 500 also includes inverters 510 and 512.

In this particular implementation, transistors 502 and 506 are p-channel transistors, while transistors 504 and 508 are n-channel transistors. Transistors 502 and 504 correspond to transistors 302 and 304 in noise suppression circuit 300 in FIG. 3. The difference between the two circuits is that the types of transistors are switched in these examples. Transistor 502 is a p-channel transistor while transistor 302 in FIG. 3 is an n-channel transistor. Transistor 504 is an n-channel transistor, while transistor 304 in FIG. 3 is a p-channel transistor. By this type of transistor selection, noise suppression circuit 500 may be used to protect for below-ground supply situations. The net result in noise suppression circuit 500 is that noise events from the supply voltage downward are suppressed.

Figure 6:
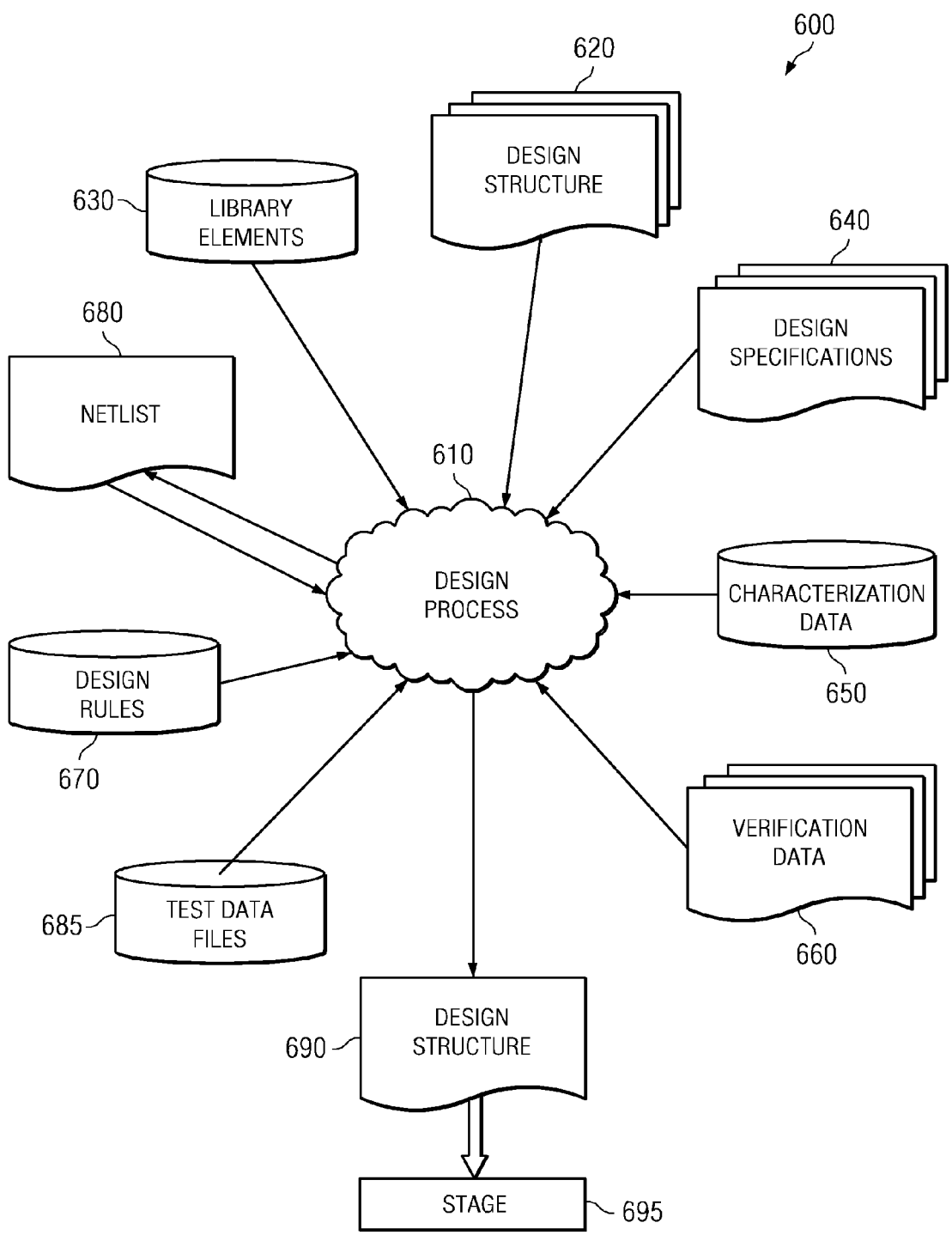
FIG. 6 is a flow diagram of a design process used in semiconductor design, manufacture, and/or test.

FIG. 6 shows a block diagram of an exemplary design flow 600 used in implementing the illustrative embodiments. Design flow 600 may include design, simulation, test, layout and manufacturing processes and mechanisms for processing design structures to generate logically or otherwise functionally equivalent representations of the embodiments of the invention shown in FIGS. 2, 3, and 5. The design structures processed and/or generated by design flow 600 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 6 illustrates multiple such design structures including an input design structure 620 that is preferably processed or executed by a design process 610. Design structure 620 may be a logical simulation design structure generated and processed by design process 610 to produce a logically equivalent functional representation of a hardware device. Design structure 620 may also or alternatively comprise data and/or program instructions that when processed or executed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission or storage medium, design structure 620 may be accessed, processed and/or executed by one or more hardware and/or software modules within design process 610 to simulate or otherwise functionally represent an electronic component, circuit, electronic or logic module, apparatus, device, or system such as those shown in FIGS. 2, 3, and 5. As such, design structure 620 may comprise files or other data structures including human and/or machine-readable source code, compiled structures, and computer-executable code structures that when processed or executed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 2, 3, and 5 to generate a netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include modules for performing circuit design processes such as timing analysis, verification, design rule checking, place and route operations and other circuit design processes known to one of skill in the art.

Design process 610 employs and incorporates logic and physical design tools such as HDL compilers and simulation model build tools to process design structure 620 together with some or all of the depicted supporting data structures to generate a second design structure 690. Similar to design structure 620, design structure 690 preferably comprises one or more files, data structures, or other computer-encoded data or instructions that reside on transmission or data storage media. Design structure 690 may be processed or executed by an ECAD system to generate a logically or otherwise functionally equivalent form of one or more of the embodiments of the invention shown in FIGS. 2, 3 and 5. In one embodiment, design structure 690 may comprise a compiled, executable HDL simulation model that functionally simulates the devices shown in FIGS. 2, 3, and 5.

Design structure 690 may also employ a data format used for the exchange of layout data of integrated circuits and/or symbolic data format (e.g. information stored in a GDSII (GDS2), GL1, OASIS, map files, or any other suitable format for storing such layout data). Design structure 690 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2, 3, and 5. Design structure 690 may then proceed to a stage 695 where, for example, design structure 690: proceeds to tape-out, is released to manufacturing, is released to a mask house, is sent to another design house, is sent back to the customer, etc.

Thus, the illustrative embodiments provide a circuit and method for minimizing noise in a signal. The circuit used in the illustrative embodiments includes a noise detection unit, a noise suppression unit, and a control unit. The noise detection unit detects changes in the signal and activates the noise suppression circuit to eliminate the noise by pulling the signal back to its original state. The control unit is used to turn the noise suppression unit on and off. The control unit turns the noise suppression unit off when a change in the state of the signal is intended. Additionally, the different illustrative embodiments implement these units using less transistors than conventionally available noise suppression circuits. This reduction in the number of transistors results in a reduction in the area in the chip needed to implement a noise suppression circuit.

The circuit, as described above, is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system comprising:
   a hardware module; and
   one or more computer-readable tangible storage devices and a design structure stored on at least one of the one or more computer-readable tangible storage devices;
   wherein a physical representation of a noise suppression circuit is generated when the design structure is processed by the hardware module;
   wherein the noise suppression circuit includes:
   a first transistor having a gate connected to a signal source, a first source/drain connected to a detect node, and a second source/drain connected to a first power supply voltage;
   a second transistor having a gate connected to the first power supply voltage, a first source/drain connected to a second power supply voltage, and a second source/drain connected to the detect node;
   a first inverter having an input connected to the detect node and an output;
   a third transistor having a gate connected to the output of the first inverter, a first source/drain connected to the first power supply voltage, and a second source/drain;
   a fourth transistor having a gate, a first source/drain connected to the signal source, and a second source/drain connected to the second source/drain of the third transistor; and
   a second inverter having an input connected to the signal source and an output connected to the gate of the fourth transistor.

2. The system of claim 1, wherein the first power supply voltage is a lower power supply voltage and the second power supply voltage is an upper power supply voltage.

3. The system of claim 1, wherein the first transistor, the second transistor, the third transistor, and the fourth transistor are field effect transistors.

4. The system of claim 1, wherein the field effect transistors are metal-oxide semiconductor field effect transistors.

5. The system of claim 4, wherein first transistor, the third transistor, and the fourth transistor are n-channel metal-oxide semiconductor field effect transistors and the second transistor is a p-channel metal-oxide semiconductor field effect transistor.

6. The system of claim 5, wherein the noise suppression circuit reduces above-ground voltage supply noise.

7. The system of claim 4, wherein first transistor, the third transistor, and the fourth transistor are p-channel metal-oxide semiconductor field effect transistors and the second transistor is a n-channel metal-oxide semiconductor field effect transistor.

8. The system of claim 1, wherein the design structure comprises a netlist.

9. The system of claim 1, wherein the second transistor is designed to allow the first transistor to change a voltage level at the detect node without requiring a change in state in signal source.

10. The system of claim 1, wherein the first inverter has a beta ratio that allows the first inverter to indicate that noise is present in the signal without having a voltage level at detect node change states.

11. The system of claim 1, wherein the second inverter has a beta ratio such that changes in a signal originating from the signal source that are considered noise are not propagated to the output of the inverter.

12. A system comprising:
    a hardware module; and
    one or more computer-readable tangible storage devices and a hardware description language (HDL) design structure that includes a plurality of elements stored on at least one of the one or more computer-readable tangible storage devices;
    wherein a machine-executable representation of a noise suppression circuit is generated when the plurality of elements are processed by the hardware module; and
    wherein the plurality of elements include:
    a first element processed to generate a functional computer-executable representation of a noise detection unit having an input and an output, wherein the input of the noise detection unit is connected to a signal and generates a signal change at the output if a change in the signal is detected;
    a second element processed to generate a functional computer-executable representation of a noise suppression unit having an input and an output, wherein the input of the noise suppression unit is connected to the output of the noise detection unit and generates a correction to the signal at the output of the noise suppression unit in response to detecting the signal change at the output of the noise detection unit; and a third element processed to generate a functional computer-executable representation of a control unit having an input and an output, wherein input the control unit is connected to the signal and turns off the noise suppression unit if a state change is detected in the signal.

13. The system of claim 12, wherein the noise detection unit comprises:
   a first transistor having a gate connected to a signal source, a first source/drain connected to a detect node, and a second source/drain connected to a first power supply voltage;
   a second transistor having a gate connected to the first power supply voltage, a first source/drain connected to a second power supply voltage, and a second source/drain connected to the detect node; and
   an inverter having an input connected to the detect node and an output.

14. The system of claim 13, wherein the noise suppression unit comprises:
   a third transistor having a gate connected to an output of the inverter, a first source/drain connected to the first power supply voltage, and a second source/drain.

15. The system of claim 14, wherein the inverter is a first inverter and wherein the noise control unit comprises:
   a fourth transistor having a gate, a first source/drain connected to the signal source, and a second source/drain connected to the second source/drain of the third transistor; and
   a second inverter having an input connected to the signal source and an output connected to the gate of the fourth transistor.

16. The system of claim 15, wherein first transistor, the third transistor, and the fourth transistor are n-channel metal-oxide semiconductor field effect transistors and the second transistor is a p-channel metal-oxide semiconductor field effect transistor.

17. The system of claim 16, wherein the noise suppression circuit reduces above-ground voltage supply noise.

18. The system of claim 15, wherein first transistor, the third transistor, and the fourth transistor are p-channel metal-oxide semiconductor field effect transistors and the second transistor is a n-channel metal-oxide semiconductor field effect transistor.

19. The system HDL design structure of claim 12, wherein the design structure resides on a storage medium as a data format used for the exchange of layout data of integrated circuits.

20. A method in a computer-aided design system including a design process that generates a functional design model of a noise suppression circuit, the method comprising:
   generating, using the design system, the functional design model of the noise suppression circuit by:
   generating, using the design system, a functional computer-executable representation of a first transistor having a gate connected to a signal source, a first source/drain connected to a detect node, and a second source/drain connected to a first power supply voltage;
   generating, using the design system, a functional computer-executable representation of a second transistor having a gate connected to the first power supply voltage, a first source/drain connected to a second power supply voltage, and a second source/drain connected to the detect node;
   generating, using the design system, a functional computer-executable representation of a first inverter having an input connected to the detect node and an output;
   generating, using the design system, a functional computer-executable representation of a third transistor having a gate connected to the output of the first inverter, a first source/drain connected to the first power supply voltage, and a second source/drain;
   generating, using the design system, a functional computer-executable representation of a fourth transistor having a gate, a first source/drain connected to the signal source, and a second source/drain connected to the second source/drain of the third transistor; and
   generating, using the design system, a functional computer-executable representation of a second inverter having an input connected to the signal source and an output connected to the gate of the fourth transistor.

* * * * *